United States Patent
Yamashita

(12) 
(10) Patent No.: US 6,376,132 B1
(45) Date of Patent: Apr. 23, 2002

(54) MASK FOR ELECTRON BEAM EXPOSURE, MANUFACTURING METHOD FOR THE SAME, AND MANUFACTURING METHOD FOR SEMICONDUCTOR DEVICE

(75) Inventor: Hiroshi Yamashita, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/560,336

(22) Filed: Apr. 28, 2000

(30) Foreign Application Priority Data

Apr. 28, 1999 (JP) .......................................... 11-123059

(51) Int. Cl.$^7$ .............................. G03F 9/00; G03C 5/00
(52) U.S. Cl. ........................................ 430/5; 430/296
(58) Field of Search ................... 430/5, 296; 250/492.2

(56) References Cited

U.S. PATENT DOCUMENTS 5,804,339 A * 9/1998 Kim ............................. 430/5

FOREIGN PATENT DOCUMENTS

JP 10-90878 4/1998

* cited by examiner

Primary Examiner—S. Rosasco
(74) Attorney, Agent, or Firm—Young & Thompson

(57) ABSTRACT

A mask material which is the same as that of a wafer to be exposed is prepared (step Q1), and the proximity effect correction dose for mask-writing is operated. Then, a resist film of the mask material is exposed by a pattern accompanying a correction dose twice the proximity effect correction dose in mask-writing at the same accelerating voltage as in wafer-exposing (step Q2). Next, the resist film is developed to form a resist film pattern, and the mask material is etched by using the resist film pattern as a mask, whereby a mask is prepared (step Q3). Thereafter, by using this mask, the resist film on the wafer is EB-exposed without proximity effect correction (step Q4). According to the present invention, the time required for calculation processing is shortened and the calculation accuracy is improved.

9 Claims, 7 Drawing Sheets

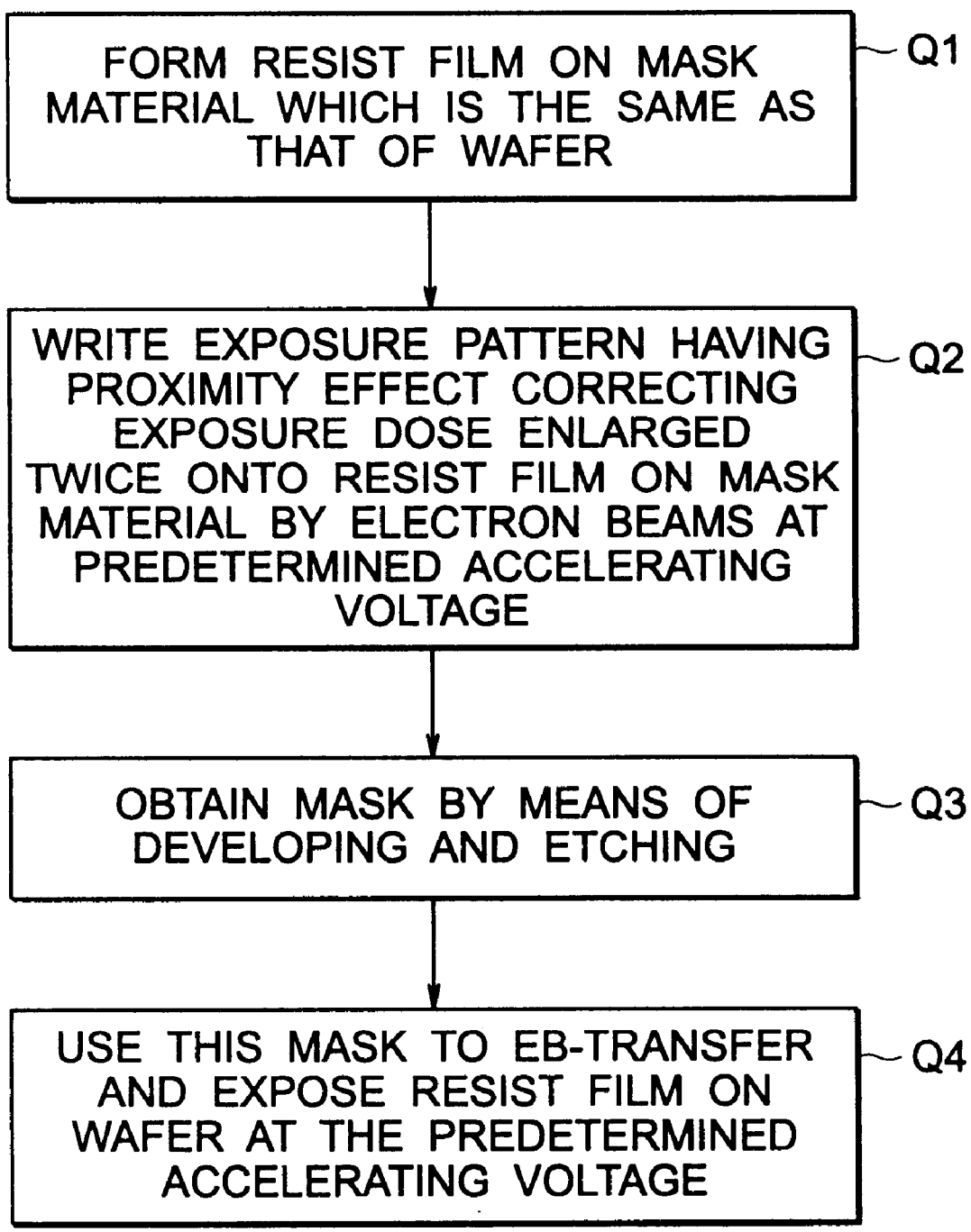

MASK FOR ELECTRON BEAM EXPOSURE, MANUFACTURING METHOD FOR THE SAME, AND MANUFACTURING METHOD FOR SEMICONDUCTOR DEVICE

BACKGROUND OF THE INVENTION

1. Field of the Invention

The present invention relates to, in a technology for exposing electron beams (EB-exposure) onto a semiconductor wafer, a mask for electron beam exposure in which the proximity effect correction method is improved, a manufacturing method for the same, and a manufacturing method for a semiconductor device using the same, and in particular to a mask for electron beam exposure being preferable as a stencil mask for a projection exposure apparatus in which the entirety or a part of a pattern corresponding to one chip is formed, a manufacturing method for the same, and a manufacturing method for a semiconductor device using the same.

2. Description of the Related Art

FIG. 1 is a drawing showing an electron optics of EB projection exposure apparatus. In this EB projection exposure apparatus, stencil mask 21 with openings formed at portions for transmitting electron beams, projection lens 22, limiting aperture 23, and object lens 24 are disposed in parallel to each other so that their center axes are matched with each other, and under the object lens 24, wafer 25 is disposed.

On the surface of the wafer 25, resist film 26 is formed, and onto the resist film 26, electron beams transmitted through the openings in the stencil mask 21 are converged by the projection lens 22, narrowed by the limiting aperture 23, and further converged by the object lens 24, and then irradiated. In the stencil mask 21, a pattern or a part of the pattern corresponding to one chip is formed, and by scanning electron beams onto the stencil mask 21, a pattern corresponding to one chip is exposed on the resist film 26 on the wafer 25.

Thus, in the EB-exposure technology, a pattern is written onto a resist film formed on a mask material by electron beams, developed, and etched to form a mask for electron beam exposure (mask-writing), and furthermore, by using this mask for electron beam exposure, electron beams are exposed to transfer the mask pattern onto the resist film on the wafer (wafer-writing). These cases have a problem whereby, due to a so-called proximity effect, the pattern line width deviates from the designed width, and therefore, mask-writing and wafer-writing are carried out by a pattern in which such a dimensional change due to the proximity effect is corrected.

That is, the proximity effect is a dimensional change caused by unevenness in pattern density, which is a phenomenon, wherein, in a case where a pattern as a target to be formed on a wafer has lines with fixed widths aligned at fixed spaces, if a negative type resist is used, the widths of the lines at both sides of the pattern become smaller than that of the normal portion at the pattern center section. This dimensional change due to the proximity effect occurs when electron beams which are transmitted through the resist film and enter inside the Si substrate are made incident again onto the resist film due to backscattering. Therefore, the sections of the resist film and Si substrate are cut into meshes. Energy deposited in the resist film due to irradiation of electron beams is calculated by a computer for each mesh. The energy distribution due to the proximity effect is simulated using an exposure intensity distribution (EID) function and is determined. By this EID function, as shown in FIG. 2, the proximity effect correction exposure dose for wafer-writing is pre-determined in accordance with the distances from the pattern end portions. By using the determined amounts as mask bias amounts, pattern dimensions of the mask for electron beam exposure are determined. The mask bias amounts make up for the decreased amounts of the line widths due to the proximity effect by increasing the exposure dose at the pattern end portions at which the line widths become smaller, whereby the decreased amounts of the resist dimensions at the pattern end portions are estimated, and the estimated amounts are added to the designed widths as bias amounts for correction.

Also, the distribution of the energy deposition due to forward scattering electrons which have directly entered from the outside into the resist film and backscattering electrons which re-enter into the resist film after scattering inside the Si substrate is as shown in FIG. 3, and this deposited energy distribution is expressed by the exposure intensity distribution (EID) function shown by the following Formula 1.

$$f(r) = k\{\exp(-r^2/\beta f^2) + \eta(\beta f^2/\beta b^2)\exp(-r^2/\beta b^2)\} \quad (1)$$

In the above formula, r is the distance from the irradiating point, $\beta f$ is the range of the deposited energy distribution due to forward scattering as shown in FIG. 3, $\beta b$ is the range of the deposited energy distribution due to backscattering, and $\eta$ is called a reflection coefficient which is a constant determined depending on the substrate material.

Thus, in order to correct the dimensional change due to the proximity effect, in the prior-art, the mask bias (the correction dose of the mask pattern) is determined by a numerical operation using the EID function and meshes, and the mask in which this mask bias is taken into consideration is used to expose electron beams onto a wafer. Likewise, when manufacturing a mask for electron beam exposure, in order to correct the proximity effect due to electron beams, a numerical operation is carried out, and based on an obtained correction exposure dose, electron beams are exposed onto the resist film on the mask material, whereby a mask is manufactured. Therefore, in the prior-art, the operation is carried out twice when manufacturing a mask and wafer-writing to correct the proximity effect.

However, since the correcting operations are performed for each of the divided meshes, complicated calculation processing is required, and therefore, correcting accuracy is low. In order to increase the correcting accuracy, the mesh size may be made smaller, however, if so, the time required for calculation becomes significantly longer, the processing takes considerable time, and throughput is lowered.

Therefore, a proximity effect correcting method has been proposed for the purpose of omitting the proximity effect correction exposure process for each wafer, and forming a high density pattern at high throughput (Japanese Laid-Open Patent Publication No. Hei-10-90878). In this proximity effect correction method, a mask substrate applied with a resist is prepared, a mask pattern is written onto the substrate resist film by means of EB-exposure, and by using a proximity effect correction mask separately prepared, correcting exposure of the pattern transferring mask is carried out. At this time, the pattern and exposure dose of the correcting mask are determined so that the pattern formed on the mask is additionally corrected (excessively corrected) for the proximity effect which will occur when EB-exposure onto a wafer later, and then, the pattern is developed and etched, whereby a pattern transferring mask whose proximity effect has already been corrected is obtained, and by using this mask, EB are exposed onto the wafer by means of transferring and exposing once. Thereby, two exposure processes including correcting exposure onto each wafer are required for exposure onto the wafer in the prior-art, however, correcting exposure is carried out during manufacturing a mask, whereby a mask whose proximity effect has already been corrected is manufactured, and by omitting the correcting exposure process for wafer-exposure, wafer-writing can be completed by the exposure process once to improve throughput.

However, also in this prior-art, as in the previous case of the prior-art, correction of the proximity effect due to electron beams when mask-writing and correction of the proximity effect due to electron beams when wafer-writing are required, and therefore, the correcting processing takes considerable time for calculation, and also, the problem of low calculation accuracy still remains.

SUMMARY OF THE INVENTION

It is an object of the present invention to provide a mask for electron beam exposure whereby the calculation accuracy can be improved, and a manufacturing method for the same, and a manufacturing method for a semiconductor device using said mask.

The mask for electron beam exposure according to the present invention is formed from the same material as that of a wafer to be exposed, and the mask has a writing pattern accompanying a correction dose twice the proximity effect correction dose in mask-writing. This writing pattern is formed by means of patterning with use of electron beams at the same accelerating voltage as in wafer-writing.

This mask for electron beam exposure is, for example, a stencil mask having openings for transmitting electron beams, or a membrane type mask having a very thin film. Also, in this mask, for example, the entirety or a part of a pattern corresponding to one chip is formed for use in a projection exposure apparatus.

The manufacturing method for a mask for electron beam exposure according to the present invention comprises the steps of calculating the proximity effect correction dose in mask-writing, exposing onto a resist film formed on the surface of a mask material which is the same material as that of a wafer to be exposed by a pattern accompanying a correction dose twice the proximity effect correction dose in mask-writing at the same accelerating voltage as in wafer-exposing, forming a resist film pattern by developing the resist film, and forming a mask by etching the mask material with use of the resist film pattern as a mask.

In this manufacturing method for a mask for electron beam exposure, for example, the mask material is an SOI (silicon on insulator) adhered substrate having an Si film formed on an $SiO_2$ film on an Si substrate, which is formed so that a resist film pattern is formed on the Si film, and the Si film is etched by using the resist film pattern as a mask. As a mask, a so-called hard mask in which the $SiO_2$ film formed on the Si film is etched by using the resist film may be used. Also, after etching the Si film, it is preferable that a process in the area matched with the patterning portion of the Si film on the Si substrate is etched and removed to expose the $SiO_2$ film is provided.

The manufacturing method for a semiconductor device according to the present invention comprises the steps of calculating the proximity effect correction dose in mask-writing, exposing onto a resist film formed on the surface of a mask material which is the same material as that of a wafer to be exposed by a pattern accompanying a correction dose twice the proximity effect correction dose in the mask-writing at the same accelerating voltage as in wafer-writing, forming a resist film pattern by developing the resist film, forming a mask by etching the mask material by using the resist film pattern as a mask, and exposing electron beams onto the resist film on the wafer at the same accelerating voltage as in the mask-writing by using said mask.

In the prior-art, in stencil mask manufacturing is processes, when mask-writing by means of electron beams, a device whose cost is relatively low is used for exposure at a relatively low accelerating voltage of approximately 20 through 50 kV. On the other hand, when wafer-writing by using this stencil mask, in order to increase throughput, it is necessary to increase electric current for the electron beams, and in order to prevent resolution from lowering due to the Coulomb interaction effect when increasing the beam current, the accelerating voltage is also increased, for example, to 50 kV or 100 kV to increase resolution.

The present invention is made by paying attention to points that the proximity effect depends on the accelerating voltage of the electron beams, and is influenced by the material of the substrate disposed under the resist film to be exposed. In other words, the exposure intensity distribution of electron beams is expressed by using the βf, βb and constant η as shown in the above mentioned Formula 1, and the βf and βb depend on the accelerating voltage of the electron beams and constant η depends on the substrate material. Therefore, the change in line width due to the proximity effect varies depending on the accelerating voltage, and if the accelerating voltage is the same, the proximity effect is also the same. Also, the proximity effect is caused by backscattering by which electron beams transmitted through the resist film scatters inside the substrate under the resist film, and the scatting beams are made incident onto the resist film again. Therefore, the degree of the change in line width due to the proximity effect is determined depending on the material of the substrate under the resist film.

Therefore, in the invention, the mask material is the same material as that of a wafer to be exposed, and a resist film formed on this mask is exposed at the same accelerating voltage as in wafer-writing, and patterning is carried out for the resist film. And, an amount for correction of the proximity effect when mask-writing is operated to determine a mask bias, and this correction dose is doubled for writing onto the mask. This doubled correction dose results by adding amounts to increase the writing line widths at the pattern end portions when mask-writing and when wafer-writing so that the line widths which are decreased due to the proximity effect when mask-writing and wafer-writing are corrected. Therefore, if the writing onto the wafer is carried out by using this mask without correction at the same accelerating voltage as in mask-writing, a pattern with line widths following the designed widths is written. In the present invention, the operation for the correction dose is carried out only once, whereby the calculation time is shortened, and furthermore, if it is supposed that the calculation time is the same as in the prior-art, the calculation accuracy can be remarkably improved by making the meshes extremely fine.

BRIEF DESCRIPTION OF THE DRAWINGS

FIG. 4 is a flowchart showing the method of the first embodiment of the invention;

DETAILED DESCRIPTION OF THE PREFERRED EMBODIMENTS

Hereinafter, the embodiments of the invention shall be described in detail with reference to the attached drawings. FIG. 4 is a flowchart showing a manufacturing method for a mask for electron beam exposure relating to the first embodiment of the invention, and a manufacturing method for a semiconductor device using the same.

First, a mask material which is the same as that of a wafer is prepared, and a resist film is formed on this mask material (step Q1).

Next, the proximity effect correction exposure dose is operated to-determine the correction exposure dose of the resist film by which a mask with line widths following the predetermined designed widths can be obtained, that is, a mask bias amount, and the resist film on the mask material is EB-exposed by a correction exposure dose resulting from doubling the mask bias amount at a predetermined accelerating voltage (step Q2).

Next, this resist film on the mask material is developed, and by using an obtained resist pattern as a mask, the mask material is etched to complete a mask for electron beam exposure (step Q3).

And, by using this mask, the resist film on the wafer is EB-exposed at the predetermined accelerating voltage (step Q4).

In the present embodiment, since a pattern having a correction dose twice the mask bias is formed when mask-writing, and EB-exposure is carried out without correction at the same accelerating voltage when wafer-writing, a pattern in which the proximity effect when mask-writing and the proximity effect when wafer-writing are corrected is exposed onto the resist film on the wafer. And, the correction operation is carried out only once to determine the mask bias, and therefore, by only mask-writing by a correction dose resulting from doubling the mask bias, the proximity effect when wafer-writing can also be corrected. Therefore, the entire operation processing time can be remarkably shortened. Also, the calculation accuracy can be easily increased by decreasing the mesh size. Furthermore, in the present embodiment, since mask-writing is carried out by EB-exposure only once, the processing processes can be reduced, and the writing accuracy is also high.

Next, the processes for manufacturing a mask for electron beam exposure relating to the present embodiment shall be described. FIGS. 5A through 5D are sectional views showing the manufacturing processes in order. The present embodiment relates to a manufacturing method for a stencil type mask having openings for transmitting electron beams.

Figure 1:
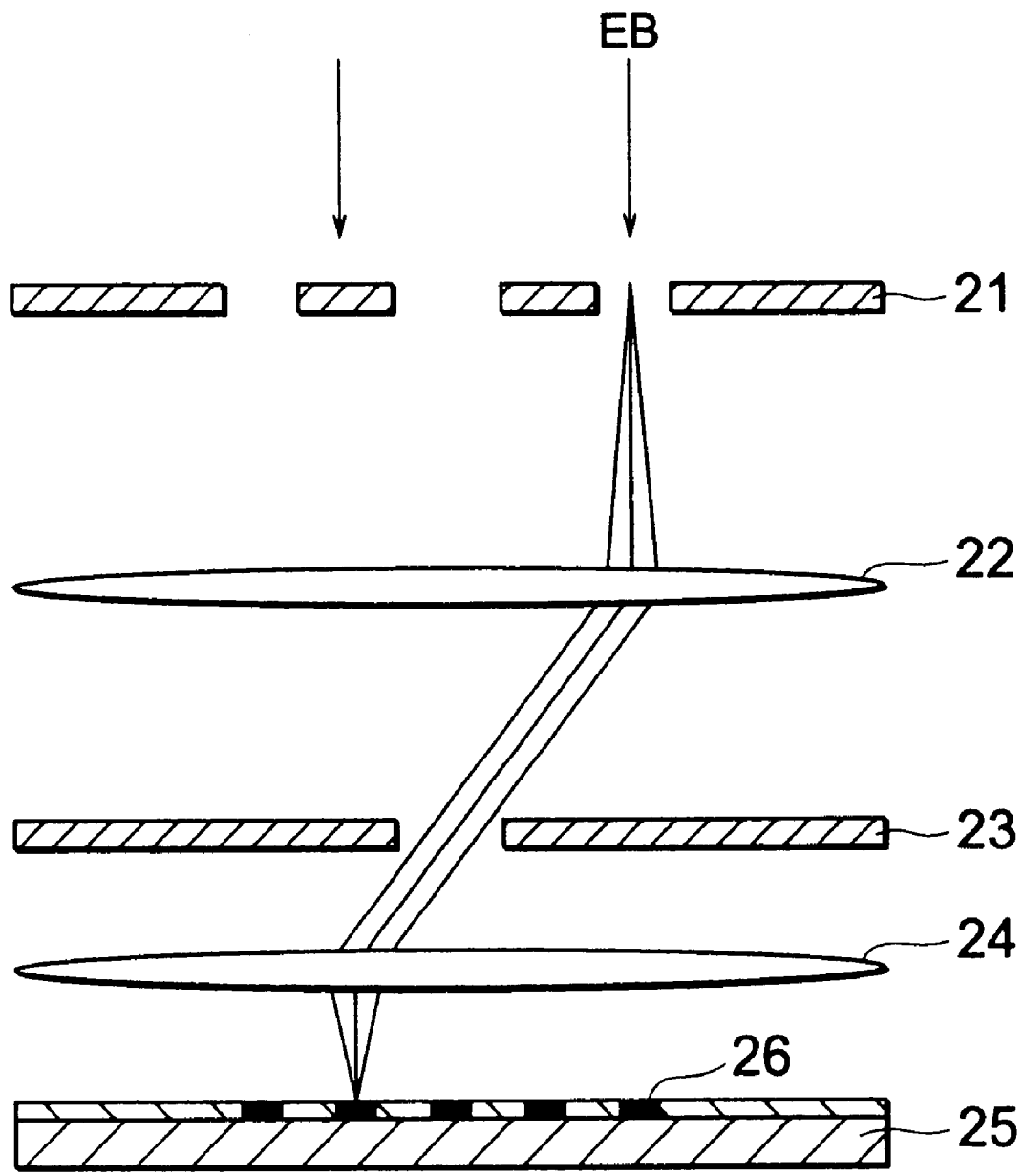
FIG. 1 is a drawing showing an electron optics of EB projection exposure apparatus.
Figure 2:
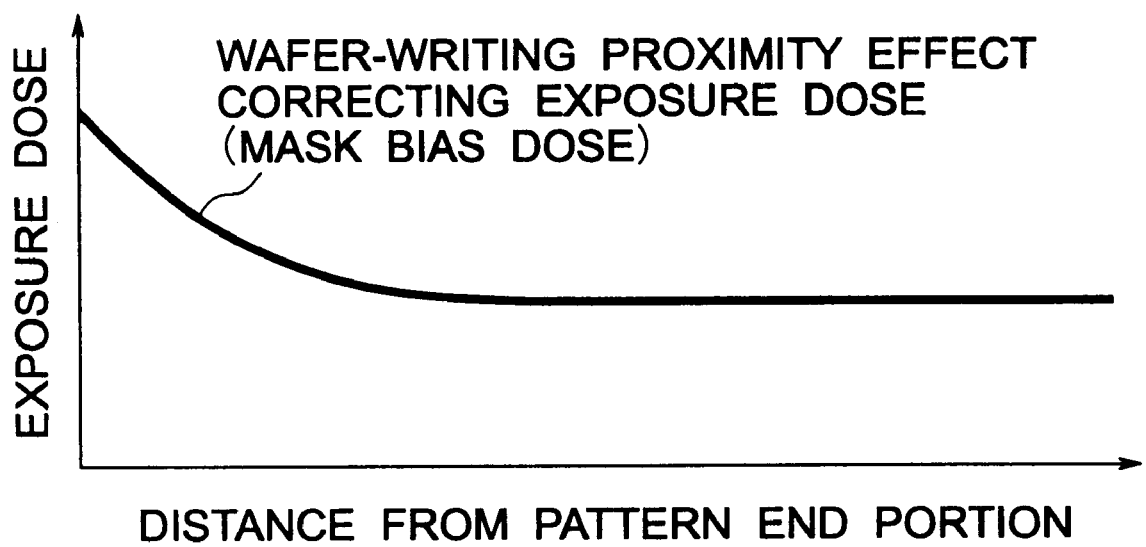
FIG. 2 is a graph showing the exposure dose pattern of the prior-art mask bias.
Figure 3:
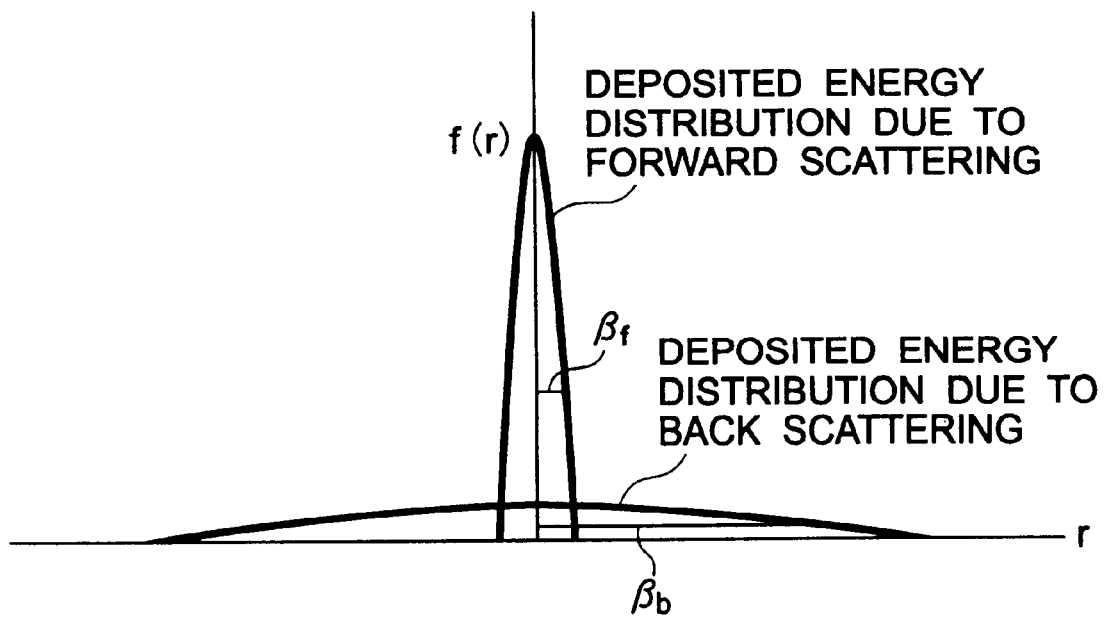
FIG. 3 is a graph showing the deposited energy distribution due to forward scattering and backscattering.
Figure 5A:
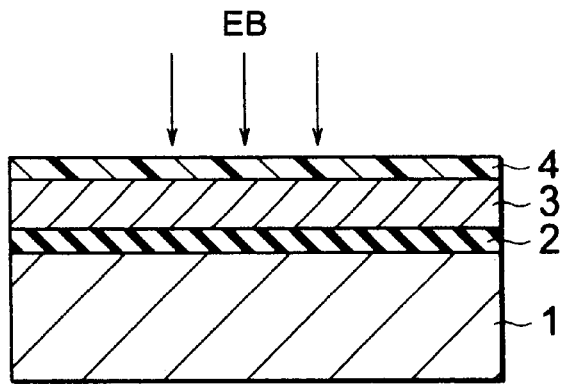
FIGS. 5A through 5D are sectional views showing mask manufacturing method in order of steps of the first embodiment.

First, as shown in FIG. 5A, an SOI substrate in which SiO$_2$ silicon oxidized film 2 formed on silicon substrate 1 and a silicon substrate (silicon film 3) are adhered together is prepared, and resist film 4 is formed on the silicon film 3 of the SOI substrate. Thereafter, resist film 4 is EB-exposed by a pattern having the above mentioned correction exposure dose.

Figure 5B:
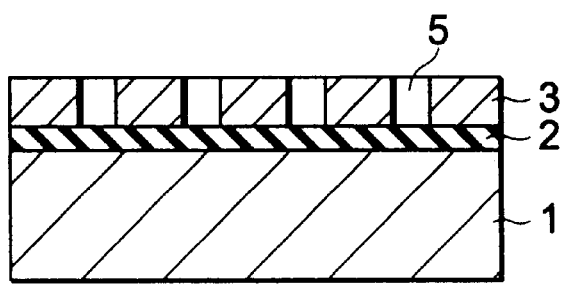

Next, as shown in FIG. 5B, the resist film 4 is developed to form a resist pattern, and by using this resist pattern as a mask, the silicon film 3 is etched to form a pattern of the silicon film 3 having openings 5 for transmitting electron beams.

Figure 5C:
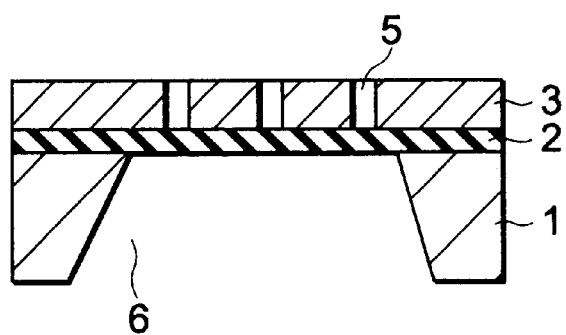

Thereafter, as shown in FIG. 5C, the center part of the silicon substrate 1 is etched and removed to form opening 6, and inside this opening 6, the silicon oxidized film 2 is exposed.

Figure 5D:
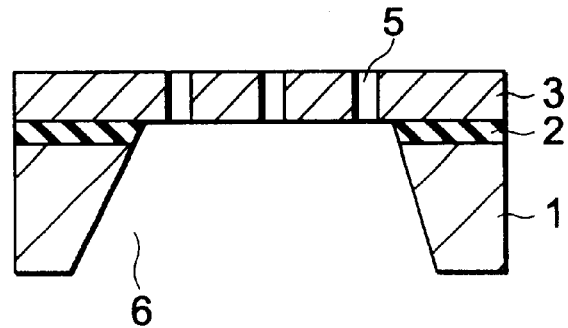

Next, as shown in FIG. 5D, by removing the silicon oxidized film 2 inside the opening 6 by fluoride acid, a stencil type mask for electron beam exposure is manufactured with the silicon film 3 supported to the side part of the silicon substrate 1.

Next, a manufacturing method for a membrane type mask onto which a mask pattern is formed by a film for shielding electron beams shall be described. In this membrane type mask, as in the stencil type, the calculation processing can be reduced. FIGS. 6A through 6D are sectional views showing the processes for manufacturing a so-called membrane type mask for electron beam exposure in order.

Figure 6A:
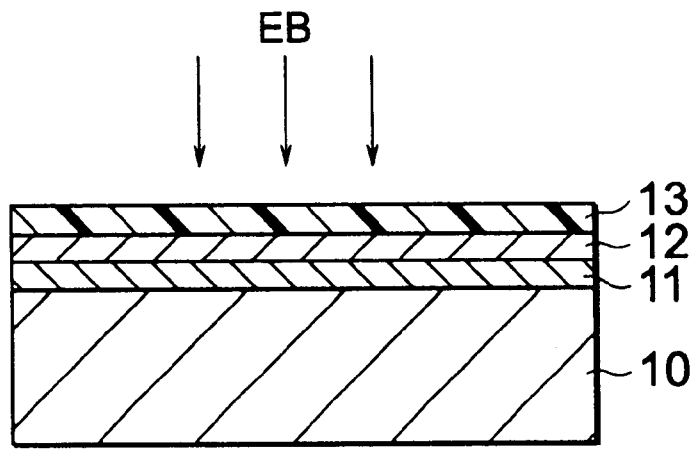
FIGS. 6A through 6C are sectional views showing the membrane type mask manufacturing method in order of steps.

In this membrane type mask, as shown in FIG. 6A, a substrate is prepared in which SiN film 11 is formed on silicon substrate 10, and a tungsten film 12 is formed on the SiN film 11, and on the tungsten film 12 of this substrate, resist film 13 is formed.

Figure 6B:
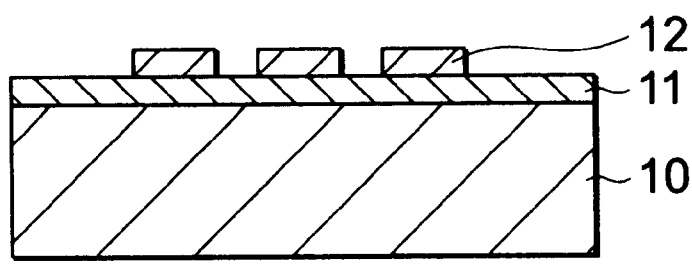

Next, as shown in FIG. 6B, the resist film 13 is EB-exposed by a pattern having the above mentioned correction exposure dose, and after the resist film 13 is developed, the tungsten film 12 is etched by an obtained resist pattern. Thereby, a pattern of the tungsten film 12 is formed on the SiN film 11.

Figure 6C:
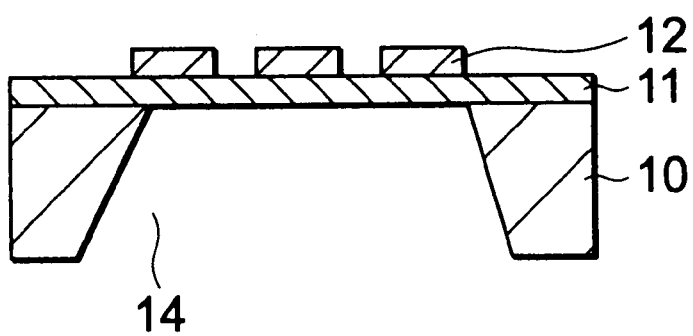

Thereafter, as shown in FIG. 6C, the center part of the silicon substrate 10 is etched and removed to expose the SiN film 11, and opening 14 is formed. Thereby, a membrane type mask formed with the pattern of the tungsten film 12 supported to the side part of the silicon substrate 10 is manufactured. In this membrane type mask, electrons greatly scattered by the tungsten film 12 are shielded by limiting aperture 23 (see FIG. 4), whereby an EB-irradiating pattern is determined.

Figure 7A:
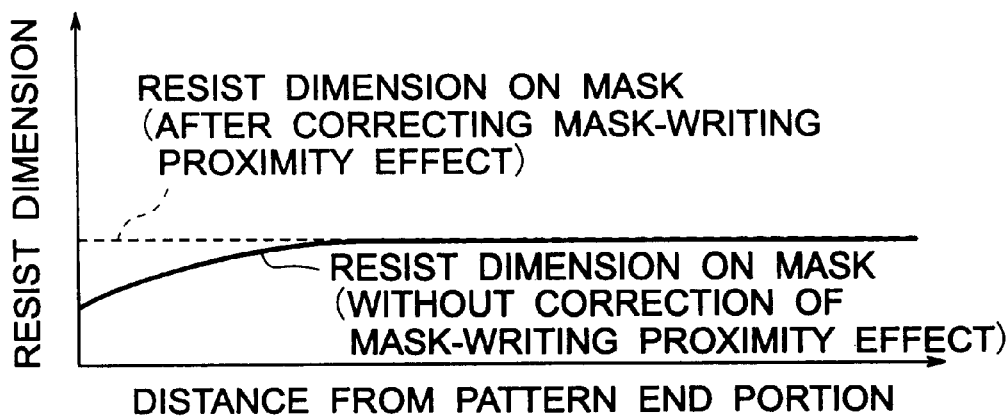
FIGS. 7A to 7C are diagrams showing the principle of the proximity effect correction of the invention.
Figure 7B:
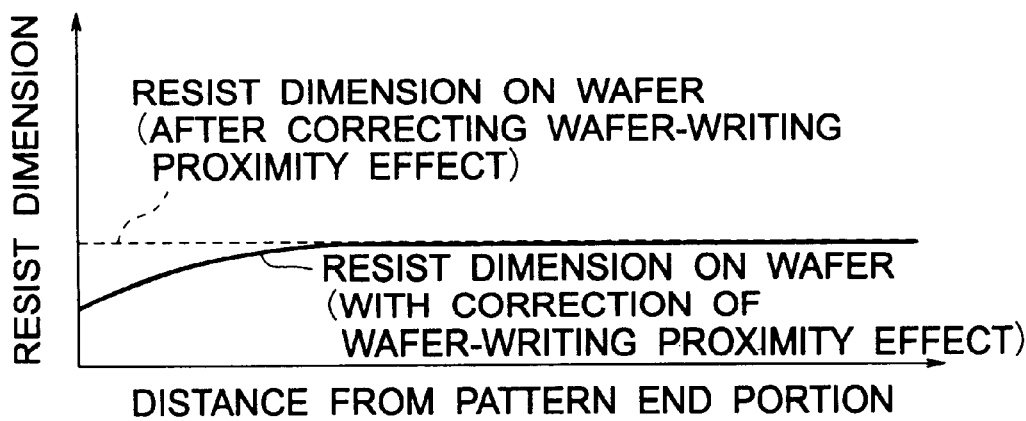
Figure 7C:
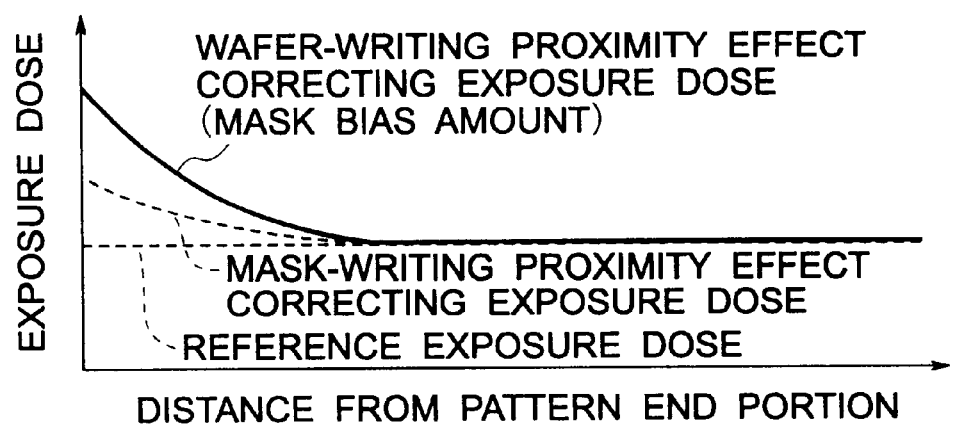

FIGS. 7A to 7C show the principle of correction of the proximity effect in the present invention. FIG. 7A is a graph showing the resist dimensions when mask-writing, FIG. 7B is a graph showing the resist dimensions when wafer-writing, and FIG. 7C is a graph showing the exposure dose. As shown by the solid line in FIG. 7A, in a case where the proximity effect when mask-writing is not corrected, the dimensions of the resist on the mask after the resist is EB-exposed and developed become smaller at the pattern end portions due to the proximity effect. On the other hand, as shown by the dashed line in FIG. 7C, in a case where, with respect to the reference exposure dose, exposure is carried out by the exposure amount after the proximity effect correction for mask-writing, and the proximity effect correction is made when mask-writing, as shown by the dashed line in FIG. 7A, the dimensions of the resist on the mask after being EB-exposed and developed are dimensions after the dimensional change due to the proximity effect is corrected, whereby dimensions following the predetermined design are obtained. That is, as shown in FIG. 7C, if the resist exposure dose at the pattern end portions is increased, large openings are opened, whereby thin line widths due to the proximity effect can be compensated.

And, as shown by the solid line in FIG. 7B, when the resist film on the wafer is EB-exposed by using the mask after the proximity effect correction when mask-writing is made (the mask shown by the dashed line in FIG. 7A), the resist dimensions at the pattern end portions become smaller due to the proximity effect. Meanwhile, as shown by the solid line in FIG. 7C, when the exposure onto the wafer is carried out at the same accelerating voltage as in mask-writing by using a mask exposed by a correction exposure dose twice the mask bias amount, as shown by the dashed line in FIG. 7B, in addition to the proximity effect when mask-writing, the proximity effect when wafer-writing is also corrected, and the dimensions of the resist film on the obtained wafer follows the predetermined designed dimensions.

Thus, mask-writing is carried out by a correction exposure dose twice the mask bias, and EB-exposure is carried out without correction calculations when wafer-writing, whereby a pattern having the predetermined designed dimensions can be formed on the resist film on the wafer.

As described above, by means of the mask bias, the pattern having the dimensions of the resist on the mask can be made flat (as shown by the dashed line in FIG. 7A), and the pattern having the dimensions of the resist on the wafer can be made flat by means of correction exposure twice the mask bias (as shown by the dashed line in FIG. 7B) since a straight-line relationship exists between the exposure dose of electron beams and the line width dimension of the resist film. That is, if the exposure dose is doubled, the width dimension of the resist film is also doubled. Therefore, by controlling the exposure amount, the line widths of the resist film can be controlled.

On the other hand, as mentioned above, the proximity effect is expressed by the exposure intensity distribution function f(r) shown in Formula 1, however, in this Formula 1, if the accelerating voltage is increased, the βf of the deposited energy distribution due to forward scattering is lowered, and the βb due to the backscattering is increased, and if the accelerating voltage is lowered, the βf due to forward scattering is increased, and the βb due to backscattering is lowered. Thus, a correlation exists between the accelerating voltage of the electron beams and the proximity effect, however, the exposure intensity function f(r) is not in proportion to the accelerating voltage, and the proximity effect correction dose determined in accordance with the energy accumulation inside the resist film is not in proportion to the accelerating voltage. Therefore, the proximity effect cannot be corrected by the accelerating voltage.

As described above, according to the invention, the same material as that of the wafer substrate is used for the mask material, and mask-writing is carried out at the same accelerating voltage as in wafer-writing, and by only doubling a correction exposure dose pattern obtained by a proximity effect correction operation when mask-writing, the obtained mask is used to carry out wafer-writing without proximity correction, whereby a resist pattern having the predetermined designed dimensions can be formed on the wafer. Therefore, the proximity correction operation is required only once, the entire calculation time is remarkably shortened, and the calculation accuracy can be improved by reducing the mesh size.

What is claimed is:

1. A method of patterning a mask for electron beam exposure comprising the steps of:

choosing a mask material for the mask, said mask material being a same material as that of a wafer to be exposed; and electron beam exposing a writing pattern on said mask using a correction dose that is twice a proximity effect correction dose used in mask-writing.

2. The method of patterning a mask for electron beam exposure as claimed in claim 1, further comprising the step of patterning the writing pattern with electron beams of a same accelerating voltage used in wafer-writing.

3. The method of patterning a mask for electron beam exposure as claimed in claim 1, further comprising selecting the mask from one of a stencil mask having openings for transmitting electron beams, and a membrane type mask having a film to shield electron beams.

4. The method of patterning a mask for electron beam exposure as claimed in claim 1, further comprising forming in said mask the entirety or a part of a pattern corresponding to one chip used for a projection exposure apparatus.

5. A method of manufacturing a mask for electron beam exposure comprising the steps of:

choosing a wafer material;

choosing a mask material being a same material as the wafer material;

calculating a proximity effect correction dose used in mask-writing;

forming a resist film on a surface of the mask material;

exposing a pattern onto the resist film using a correction dose having twice a proximity effect correction dose as calculated in said calculating step;

forming a resist film pattern by developing the resist film; and forming a mask by etching the mask material with the resist film pattern as a mask.

6. The method of manufacturing a mask for electron beam exposure as claimed in claim 5, further comprising:

choosing an SOI adhered substrate comprising a Si film formed on a first $SiO_2$ film formed on a Si substrate in said choosing a mask material step;

forming the resist film pattern on the Si film in said forming a resist film pattern step; and etching the Si film by using the resist film pattern as a mask in said forming a mask step.

7. The method of manufacturing a mask for electron beam exposure as claimed in claim 6, further comprising:

etching an area matched with the patterning portion of the Si film on the Si substrate, after said etching the Si film step; and removing the area matched with the patterning portion of the Si film to expose the $SiO_2$ film.

8. The method of manufacturing a mask for electron beam exposure as claimed in claim 6, further comprising forming a second $SiO_2$ film on the Si film; and etching the second $SiO_2$ film together with the Si film to form a mask pattern.

9. A manufacturing method for a semiconductor device comprising the steps of:

choosing a wafer material;

choosing a mask material being a same material as the wafer material;

calculating a proximity effect correction dose used in mask-writing;

forming a resist film on the mask material;

exposing onto the resist film a pattern using a correction dose having twice a proximity effect correction dose used in mask-writing, said exposing being at a same accelerating voltage as used in wafer-writing;

developing the resist film to form a resist film pattern;

etching the mask material to form a mask by using the resist film pattern as the mask; and exposing electron beams onto the resist film on the wafer by using the mask at the same accelerating voltage as in mask-writing.

* * * * *